United States Patent
Fujii

(10) Patent No.: US 8,497,576 B2
(45) Date of Patent: Jul. 30, 2013

(54) SEMICONDUCTOR DEVICE

(71) Applicant: Elpida Memory, Inc., Tokyo (JP)

(72) Inventor: Seiya Fujii, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/632,608

(22) Filed: Oct. 1, 2012

(65) Prior Publication Data

US 2013/0026652 A1    Jan. 31, 2013

Related U.S. Application Data

(63) Continuation of application No. 12/641,657, filed on Dec. 18, 2009, now Pat. No. 8,304,877.

(30) Foreign Application Priority Data

Jan. 6, 2009    (JP) .................................. 2009-000749

(51) Int. Cl.
    *H01L 23/48* (2006.01)
(52) U.S. Cl.
    USPC ........................................................ 257/686
(58) Field of Classification Search
    USPC .. 257/685, 686, 723, 726, E25.031–E25.032, 257/41, 91, 99, 177–182, 276, 457, 459, 257/502, 503, 573, 584, 602, 621, 664–677, 257/688–700, 734–786, E23.01–E23.079, 257/E23.141–E23.179, 81, 82; 438/6, 28, 438/66, 67, 107, 109, 406, 455–459, 83, 438/98, 100, 101
    See application file for complete search history.

(56) References Cited

U.S. PATENT DOCUMENTS

| | | | | |
|---|---|---|---|---|
| 5,424,245 | A * | 6/1995 | Gurtler et al. ................ | 438/107 |
| 6,239,495 | B1 * | 5/2001 | Sakui et al. .................. | 257/777 |
| 6,444,576 | B1 * | 9/2002 | Kong ............................ | 438/667 |
| 7,115,972 | B2 | 10/2006 | Dotta et al. | |
| 7,122,912 | B2 | 10/2006 | Matsui | |
| 2005/0040509 | A1 * | 2/2005 | Kikuchi et al. .............. | 257/686 |
| 2005/0248018 | A1 | 11/2005 | Morkner | |
| 2007/0290300 | A1 * | 12/2007 | Kawakami .................... | 257/621 |
| 2008/0036082 | A1 | 2/2008 | Eun | |
| 2010/0047966 | A1 * | 2/2010 | Silvestri ........................ | 438/109 |

FOREIGN PATENT DOCUMENTS

| | | |
|---|---|---|
| JP | 2001-168270 A | 6/2001 |
| JP | 2004-281980 A | 10/2004 |
| JP | 2005-268299 A | 9/2005 |

* cited by examiner

*Primary Examiner* — Dao H Nguyen
*Assistant Examiner* — Tram H Nguyen
(74) *Attorney, Agent, or Firm* — Foley & Lardner LLP

(57) ABSTRACT

A semiconductor device which has a plurality of semiconductor chips stacked on a substrate. The semiconductor device includes semiconductor chip 2, semiconductor chip 3*a* stacked on substrate 4 together with semiconductor chip 2, and having a foot print larger than semiconductor chip 2, through electrode 22 extending through semiconductor chip 2 only in a central portion of semiconductor chip 2, through electrode 32 extending through semiconductor chip 3*a* at a position facing to through electrode 22, and conduction bump 7*b* arranged between through electrode 22 and through electrode 32, and conductively connecting through electrode 22 with through electrode 32.

20 Claims, 9 Drawing Sheets

SEMICONDUCTOR DEVICE

CROSS-REFERENCE TO RELATED PATENT APPLICATIONS

This application is a continuation of U.S. application Ser. No. 12/641,657, filed Dec. 18, 2009, which claims benefit of priority from the prior Japanese Application No. 2009-000749, filed on Jan. 6, 2009; the entire contents of all of which are incorporated herein by reference.

BACKGROUND OF THE INVENTION

1. Field of the Invention

The present invention relates to a semiconductor device in which pluralities of semiconductor chips are stacked on a substrate.

2. Description of Related Art

In recent years, a structure in which semiconductor chips are stacked within a package is required for a semiconductor device which comprises semiconductor chips, in order to realize a high density array of semiconductor chips, associated with diversified functions. In a semiconductor device of such a structure, semiconductor chips are generally connected to a substrate through wire bonding. However, when the wire bonding is used as wires for connecting respective semiconductor chips to a substrate, long wires required therefore will prevent fast operation of the semiconductor chips. Accordingly, a semiconductor device with reduced lengths of wires has been proposed and disclosed in Japanese Patent Laid-Open No. 2004-281980. Japanese Patent Laid-Open No. 2004-281980 describes a semiconductor device in which a semiconductor chip is formed with through electrodes such that the semiconductor chip and substrate are interconnected through the through electrodes, in order to reduce the length of wires.

Also, in some semiconductor devices structured to stack semiconductor chips within a package, a plurality of substrates, each mounted with a semiconductor chip, are stacked, and the substrates are interconnected with bumps. In the semiconductor device of this structure, the semiconductor chips are generally mounted on the substrates by heating. At this time, due to a difference in the thermal coefficient of expansion between silicon which is a main component of the semiconductor chips and a resin which is a main component of the substrates, the degree of bowing differs depending on the type of materials. Consequently, the bumps undergo peel stress which acts to peel off the connections between the substrates. Thus, a semiconductor device for alleviating this peel stress has been proposed and disclosed in Japanese Patent Laid-Open No. 2005-268299. Japanese Patent Laid-Open No. JP-2005-268299 describes a semiconductor device. The semiconductor device is provided with a particular region where bumps are arrayed on only one end side of a substrate on which no semiconductor chip is mounted, in order to alleviate a peel stress.

In a semiconductor device which comprises a plurality of semiconductor chips formed with through electrodes, mounted on a substrate, like the semiconductor device described in Japanese Patent Laid-Open No. 2004-281980, an electronic circuit provided for each semiconductor chip is generally formed on a flat planar base made of silicon nitride or polyimide, which has a thermal coefficient of expansion larger than that of silicon which is a main component of the semiconductor chip, in a high-temperature atmosphere. For this reason, at room temperatures, the circuit formation surface largely contracts as compared with silicon, resulting in bowing of the semiconductor chip. Now, a description will be given of a problem which can arise when two semiconductor chips connected to each other and stacked one on the other differ in foot print (chip size) and/or materials used for the circuit formation surface.

FIG. 1 is a cross-sectional view of an exemplary state showing how each chip bows when two semiconductor chips are stacked on a substrate and connected to each other, where they differ from each other in foot print and materials used for the circuit formation surface. In FIG. 1, logic chip 101 and memory chip 111 which has a larger foot print than logic chip 101, are stacked on substrate 121. A logic circuit is arranged on circuit formation surface 102 of logic chip 101 which is formed without using polyimide. On the other hand, a memory circuit is arranged on circuit formation surface 112 of memory chip 111 which is formed using polyimide. Also, conduction bumps 201 are arranged between through electrodes 113 which extend through memory chip 111 and through electrodes 103 which extend through logic chip 101, such that through electrodes 113 and through electrodes 103 are connected by these conduction bumps 201.

Since logic chip 101 and memory chip 111 differ in foot print and materials used to form the circuits, the amount in which logic chip 101 will bow, as a whole, is smaller than the amount in which memory chip 101 will bow. This difference in the amount of bowing is larger at points further away from the center of the chips, as shown in FIG. 1. Since a larger difference in the amount of bowing results in an increase in the peel stress that acts on conduction bumps 201 to peel off connections between the chips, conduction bumps 201 are more susceptible to rupture since they are located closer to the outer periphery of logic chip 101. Consequently, a defective connection is more likely to occur between logic chip 101 and memory chip 111.

In regard to the above problem, the semiconductor device disclosed in Japanese Patent Laid-Open No. 2005-268299 is provided on the precondition 3 that a plurality of substrates, each mounted with a semiconductor chip, are stacked one on another, and comprises bumps arrayed on one end side in regions of the substrates on which chips are not mounted. Accordingly, JP-2005-268299A is not applicable to a semiconductor device which comprises a plurality of semiconductor chips formed with through electrodes, which are stacked one on anther and connected through conduction bumps, as shown in FIG. 1.

SUMMARY

The present invention seeks to solve one or more of the above problems, or to improve upon those problems at least in part.

In one embodiment, there is provided a semiconductor device includes a first semiconductor chip, a second semiconductor chip stacked on a substrate together with the first semiconductor chip, the second semiconductor chip having a foot print larger than the first semiconductor chip, a first through electrode extending through the first semiconductor chip only in a central portion of the first semiconductor chip, a second through electrode extending through the second semiconductor chip at a position facing to the first through electrode, and a conduction bump arranged between the first through electrode and the second through electrode, and conductively connecting the first through electrode with the second through electrode.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
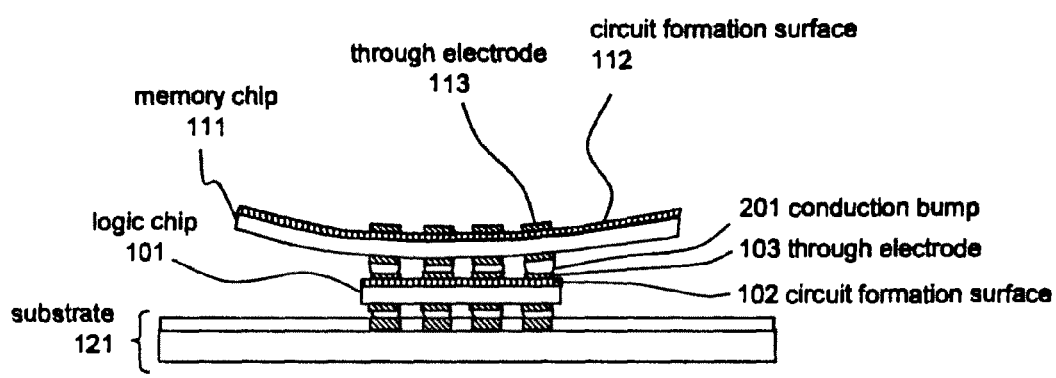
FIG. 1 is a cross sectional view of an exemplary state showing how each chip bows when two semiconductor chips are stacked on a substrate and are connected to each other, where they differ from each other in foot print and materials used for the circuit formation surface.
Figure 2:
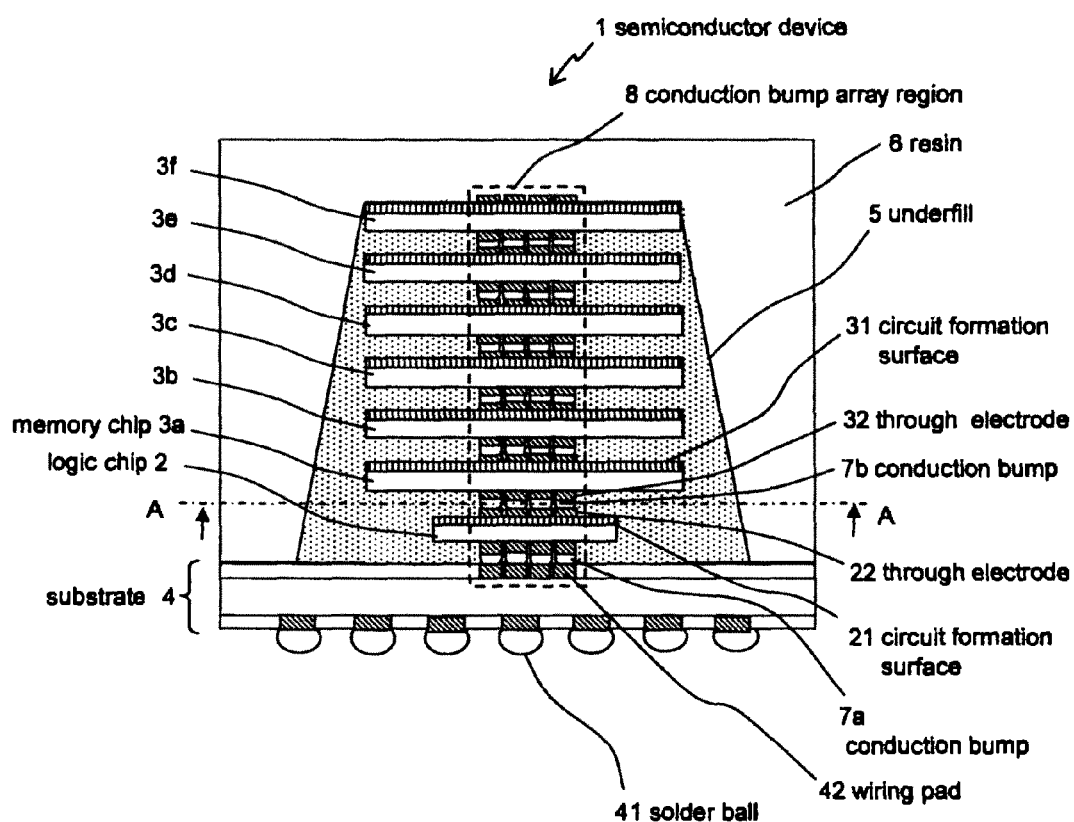
FIG. 2 is a cross-sectional view showing the structure of a semiconductor device according to a first embodiment.
Figure 3:
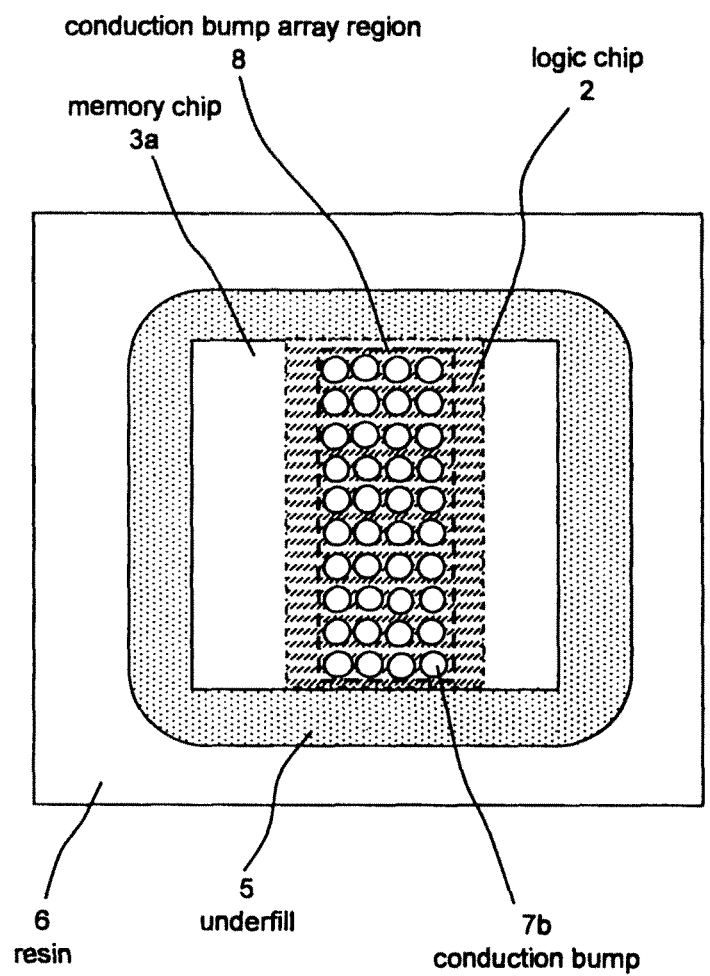
FIG. 3 is a cross-sectional view taken along cut line A-A drawn in FIG. 2.

FIG. 2 is a cross-sectional view showing the structure of a semiconductor device according to a first embodiment. FIG. 3 is a cross-sectional view taken along cut line A-A drawn in FIG. 2.

As shown in FIG. 2, semiconductor device 1 of this embodiment comprises logic chip 2 and memory chips 3a-3f which have a larger foot print than logic chip 2. Logic chip 2 and memory chips 3a-3f are stacked on substrate 4. Logic chip 2 is mounted on substrate 4, while memory chips 3a-3f are stacked above logic chip 2. Underfill 5 is filled in a gap between logic chip 2 and substrate 4 and in gaps between the respective chips. Underfill 5 is covered with resin 6. In the following, a detailed description will be given of the manner in which the respective chips are interconnected.

Notably, the present invention is not particularly limited in the number of logic chips or the number of memory chips. Also, this embodiment is structured to mount logic chip 2 on the layer closest to substrate 4 (lowermost layer) in order to give higher priority to faster operations, but in the present invention, logic chip 2 may be disposed between any memory chips 3a-3f.

Logic chip 2, which is one of semiconductor chips, comprises, on the top surface, circuit formation surface 21 on which a logic circuit is formed, and through electrode 22 which extend through logic chip 2 only in a central portion thereof, as shown in FIG. 2. One end of through electrode 22 is connected to wiring pad 42 through conduction bump 7a. Substrate 4 is provided with solder balls 41 on its bottom surface for mounting semiconductor device 1 to another device.

Memory chip 3a, which is one of semiconductor chips, is positioned on the lowermost layer within the memory chips, and comprises circuit formation surface 31 on which a memory circuit is formed, and through electrode 32 which extend through memory chip 3a at positions facing to through electrode 22, as shown in FIG. 2. The number of through electrodes 33 is not particularly limited, as is the case with through electrode 22.

As shown in FIGS. 2 and 3, conduction bump 7b is arranged between the other end of through electrode 22 and through electrode 32, such that logic chip 2 and memory chip 3a are conductively connected (electrically connected) through conduction bump 7b. This conduction bump 7b undergoes peel stress due to a difference in the amount of bowing resulting from a difference in foot print between logic chip 2 and memory chip 3a, and a difference in materials between circuit formation surfaces 21, 31. However, since through electrode 22 are concentrated in a central portion of logic chip 2, conduction bump 7b undergoes an alleviated peel stress. This is because the difference in bowing amount between logic chip 2 and memory chip 3a is smaller at a site closer to the central portion of the chip.

Memory chips 3b-3f each comprise circuit formation surface 31 and through electrode 32 like memory chip 3a. Then, conduction bump 7b is arranged between through electrode 32 of the respective memory chips, such that memory chips 3a-3f are conductively connected through conduction bump 7b. In other words, through electrode 32 that are need to connect memory chips 3a-3f are concentrated in conduction bump array region 8 which matches a region above the central portion of logic chip 2. With such a layout, even if two memory chips that are faced each other, such as memory chips 3b, 3c by way of example, suffer from different amounts of bowing, peel stress will be alleviated on conduction bump 7b arranged between memory chips 3b and 3c. This is because the difference in the amount of bowing between two chips of the same foot print is also smaller at a site closer to the center of the chips, as is the case with the difference in the amount of bowing between two chips having different foot prints.

Accordingly, in this embodiment, conduction bump 7b is concentrated only in a region which undergoes relatively small peel stress caused by the bowing of each chip, thus making it possible to avoid a lower yield rate and degraded reliability due to rupture of conduction bump 7b.

Notably, this embodiment is not limited to a combination of a logic chip and memory chips which differ in foot print from each other, but can be applied to connections between chips or between a chip and a substrate, which bow in different amounts from each other. The present invention is not either limited to the type or the number of chips.

Figure 4:
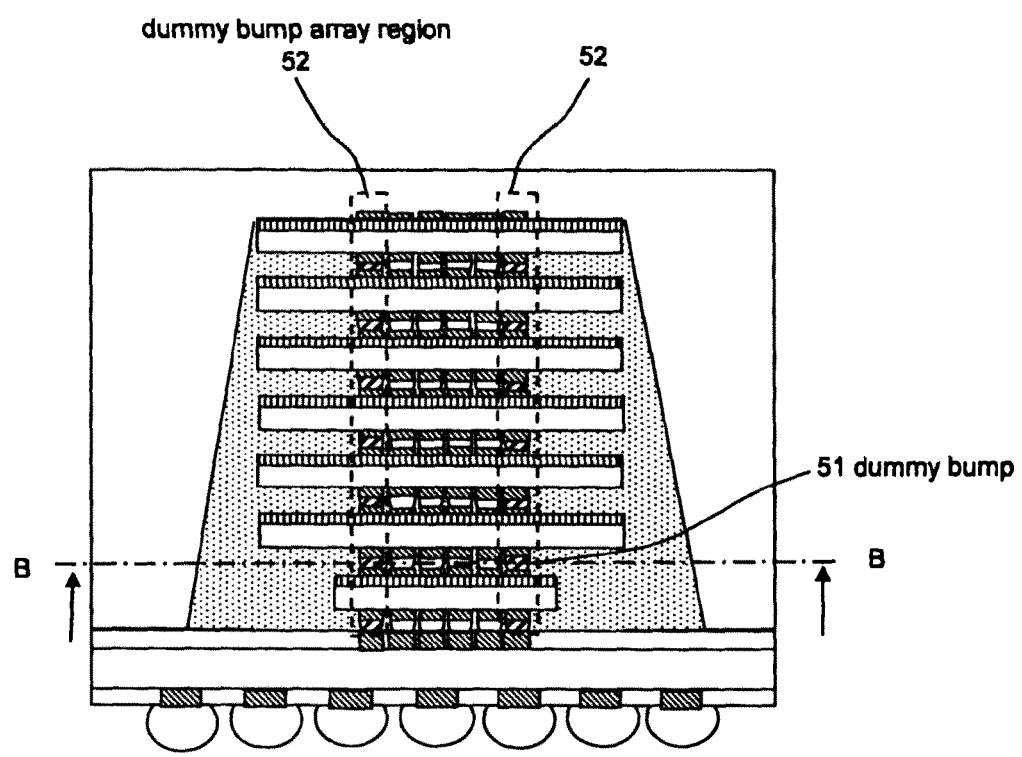
FIG. 4 is a cross-sectional view showing a structure which comprises dummy bump array region 52 in the semiconductor device of the first embodiment.
Figure 5:
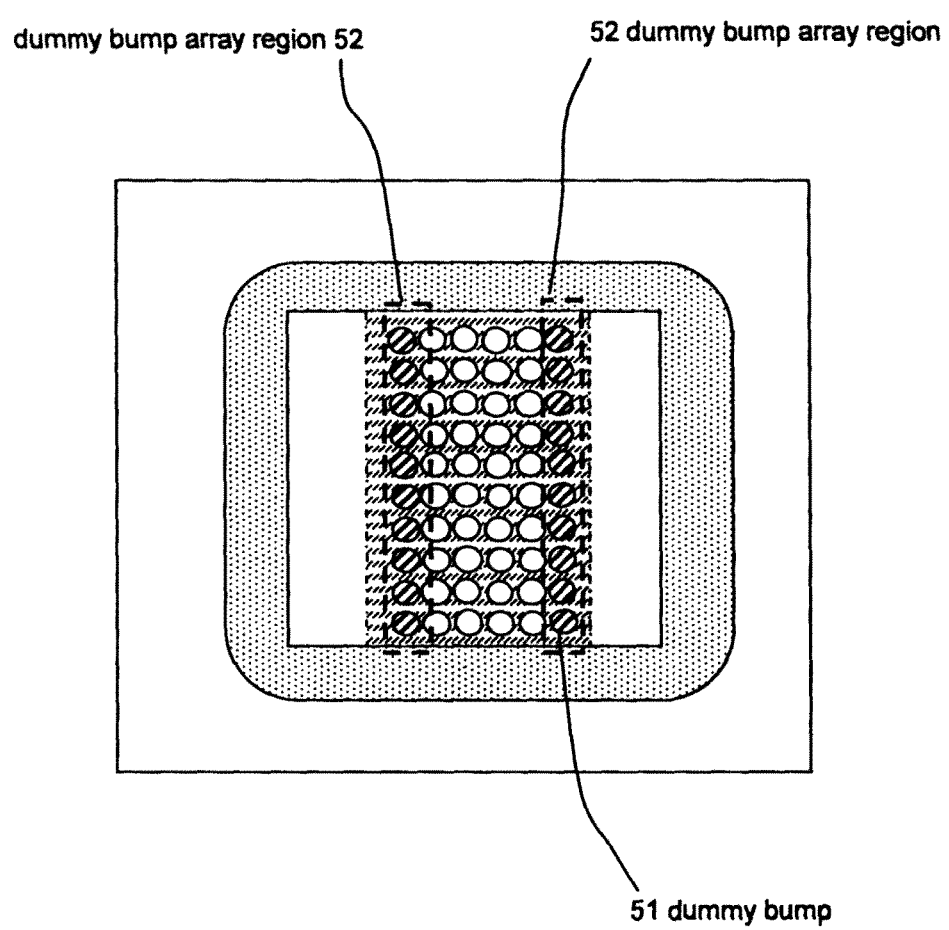
FIG. 5 is a cross-sectional view taken along cut line B-B drawing in FIG. 4.

Also, in this embodiment, as shown in FIG. 4 and FIG. 5 which is a cross-sectional view taken along cut line B-B drawn in FIG. 4, dummy bump array region 52 may be defined outside of conduction bump array region 8. Dummy bump array region 52 is populated with dummy bumps 51 which do not require conduction between chips. Dummy bump array region 52 undergoes larger peel stress than conduction bump array region 8, and connections between chips are reinforced by disposing dummy bumps 51 in this region. This makes conduction bump 7b that are need to make a connection between the chips, less susceptible to rupture, thus further improving reliability.

Second Embodiment

Figure 6:
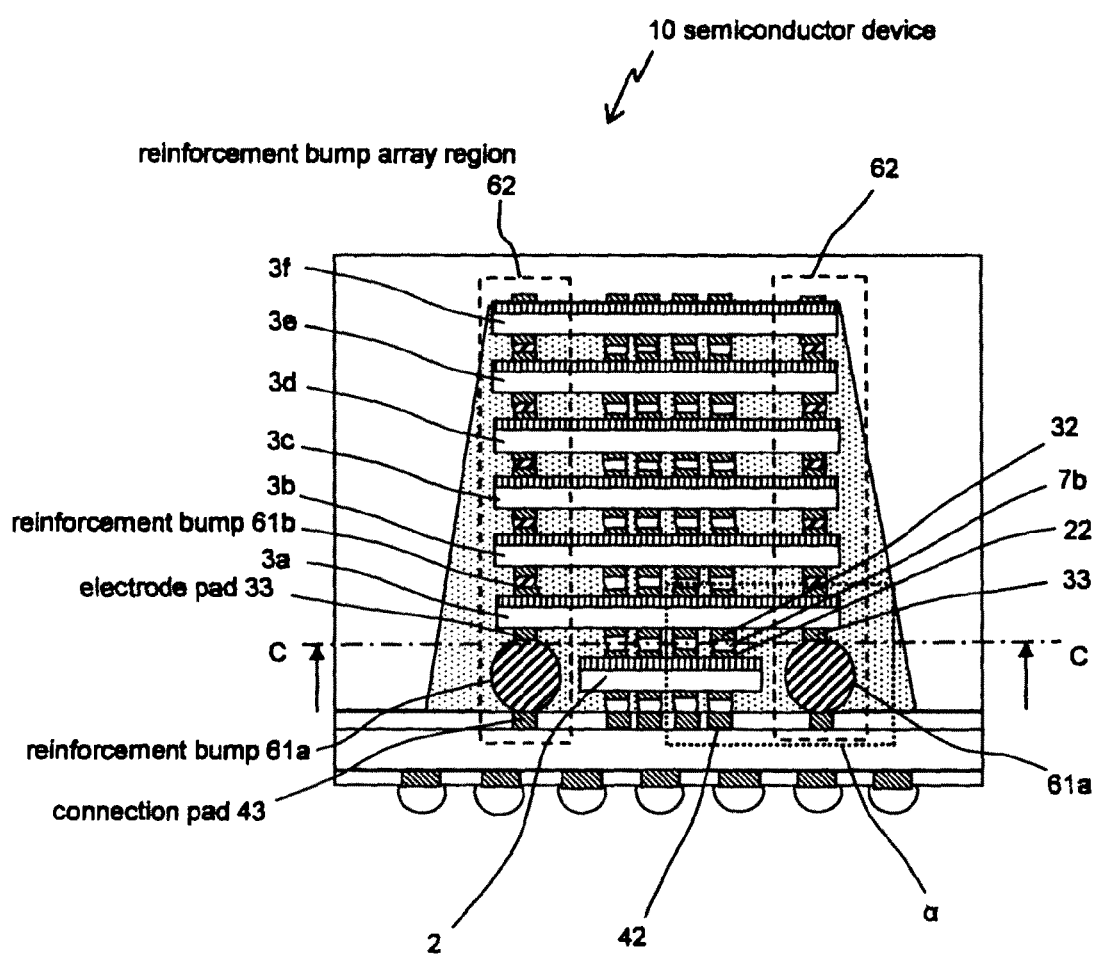
FIG. 6 is a cross-sectional view showing the structure of a semiconductor device according to a second embodiment.
Figure 7:
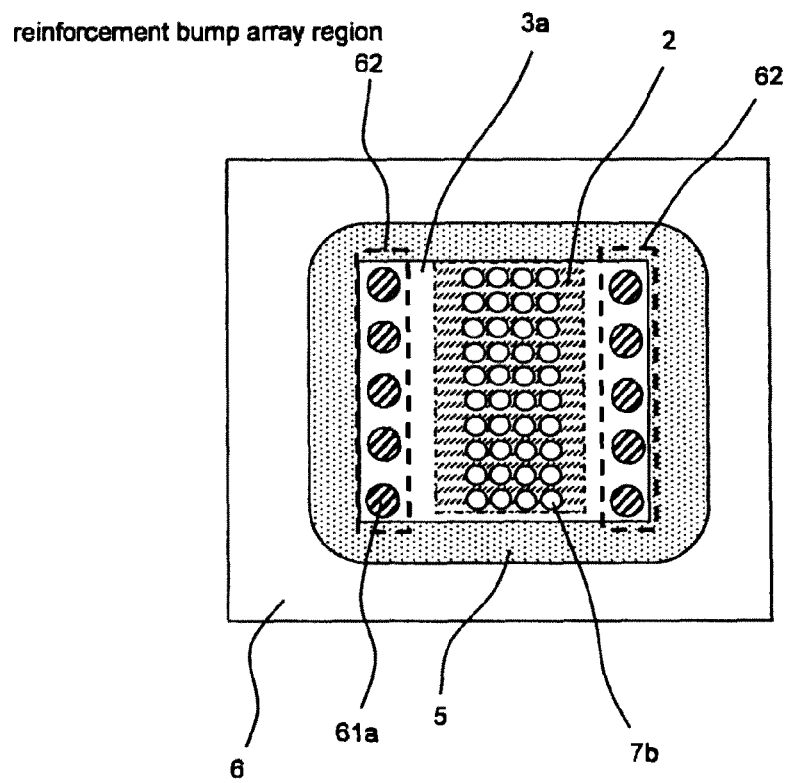
FIG. 7 is a cross-sectional view taken along cut line C-C drawn in FIG. 6.
Figure 8:
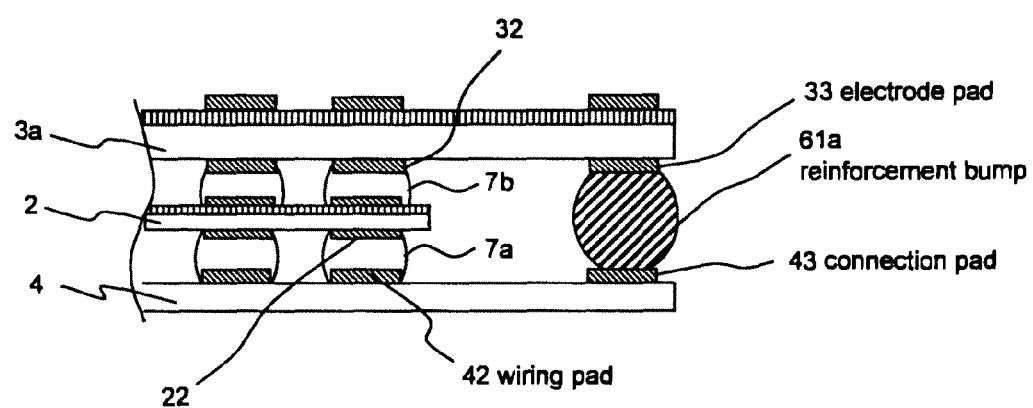
FIG. 8 is an enlarged view of region depicted in FIG. 6.

FIG. 6 shows the structure of a semiconductor device according to a second embodiment. FIG. 7 is a cross-sectional view taken along cut line C-C drawn in FIG. 6. FIG. 8 is an enlarged view of region depicted in FIG. 6. In the respective figures, components similar to those of semiconductor device 1 shown in FIG. 2 are designated the same reference numerals, and detailed descriptions thereon are omitted.

Semiconductor device 10 of this embodiment comprises reinforcement bump 61a connecting memory chip 3a with substrate 4, and reinforcement bump 61b connecting memory chips 3a-3f.

In semiconductor device 10, memory chips 3a-3f are provided with electrode pad 33 in outer peripheral regions thereof. Electrode pad 33 is similar in shape and size to through electrode 32. Also, connection pad 43 similar in shape and size to wiring pad 42 is disposed at positions on substrate 4 facing to electrode pad 33 of memory chip 3a. Reinforcement bump 61a, having a larger diameter than conduction bump 7b, are disposed between electrode pad 33 of memory chip 3a and connection pad 43, such that memory chip 3a and substrate 4 are connected through reinforcement bump 61a. Since this connection restrains the amount of bowing that occurs in memory chip 3a, the difference in the amount of bowing is reduced between memory chip 3a and logic chip 2. Consequently, conduction bump 7b undergoes alleviated peel stress. Also, reinforcement bump 61b is arranged between electrode pads 33 of the respective memory chips, such that the respective memory chips are connected through this reinforcement bump 61b. This connection reinforces the connections between the logic chip and the memory chip as well as between the respective memory chips, thus making it possible to avoid a lower yield rate and lower reliability due to rupture of conduction bump 7b.

In this embodiment, reinforcement bumps array region 62 in which reinforcement bump 61a, 61b are arranged is defined in an outer peripheral region of each memory chip which undergoes a relatively large amount of bowing. This results in alleviating a peel stress which acts on conduction bump 7b that is need to connect the conduction of memory chip 3a to logic chip 2. Consequently, the connection is reinforced between logic chip 2 and memory chip 3a. Also, when reinforcement bumps 61a, 61b can be conductively connected, i.e., when reinforcement bumps 61a, 61b are utilized for establishing an electric connection between each memory chip and substrate 4, the stability of the source potential and the ground potential can be improved in memory chips 3a-3f.

Figure 9:
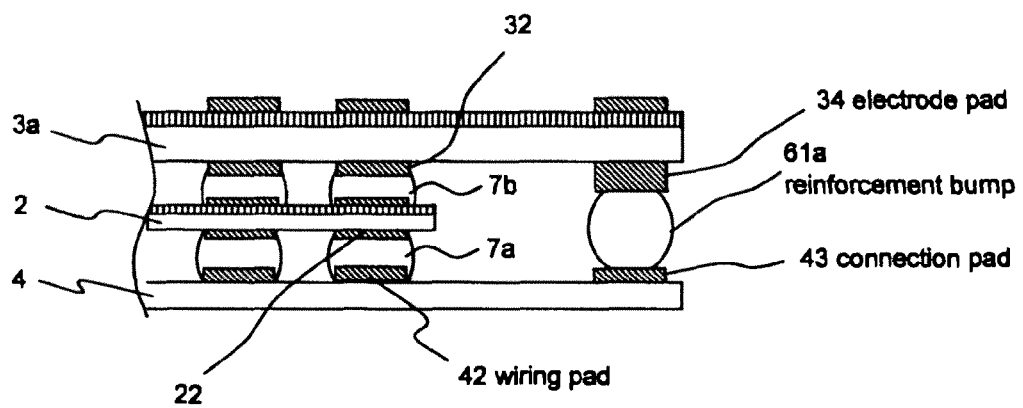
FIG. 9 is an enlarged view showing a structure which comprises electrode pads 34 that are higher than through electrode 32, provided instead of electrode pad 33, in the semiconductor device of the second embodiment.
Figure 10:
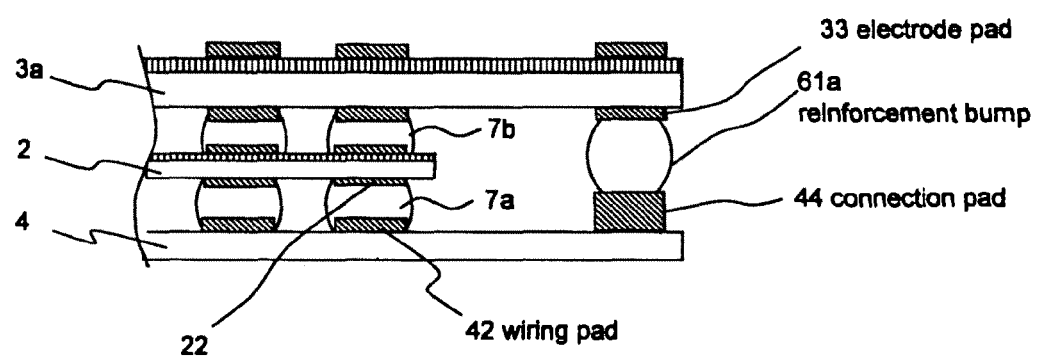
FIG. 10 is an enlarged view showing a structure which comprises connection pad 44 that are higher than wiring pad 42, provided instead of connection pad 43, in the semiconductor device of the second embodiment.

Alternatively, in this embodiment, if the connection of memory chip 3a with substrate 4 is sufficiently reinforced even if reinforcement bump 61a are made in the same shape and size as conduction bump 7b, electrode pad 34 that is higher than through electrode 32 may be used instead of electrode pad 33, while filling a gap resulting from a reduction in the diameter of reinforcement bump 61a, as shown in FIG. 9. Further alternatively, as shown in FIG. 10, connection pad 44 that is higher than wiring pad 42 may be used instead of connection pad 43, while filling a gap resulting from a reduction in the diameter of reinforcement bump 61a.

When electrode pads 34 are used instead of electrode pad 33, wiring pad 42 and connection pad 43 can be unified in design dimensions, and conduction bump 7b and reinforcement bump 61a can further be unified in design dimensions, the manufacturing cost of semiconductor device 10 is expect to be reduced. On the other hand, when connection pad 44 are used instead of connection pad 43, through electrode 32 and electrode pad 33 can be unified in design dimensions, and conduction bump 7b and reinforcement bump 61a can further be unified in design dimensions, the manufacturing cost of semiconductor device 10 is expect to be reduced.

Third Embodiment

Figure 11:
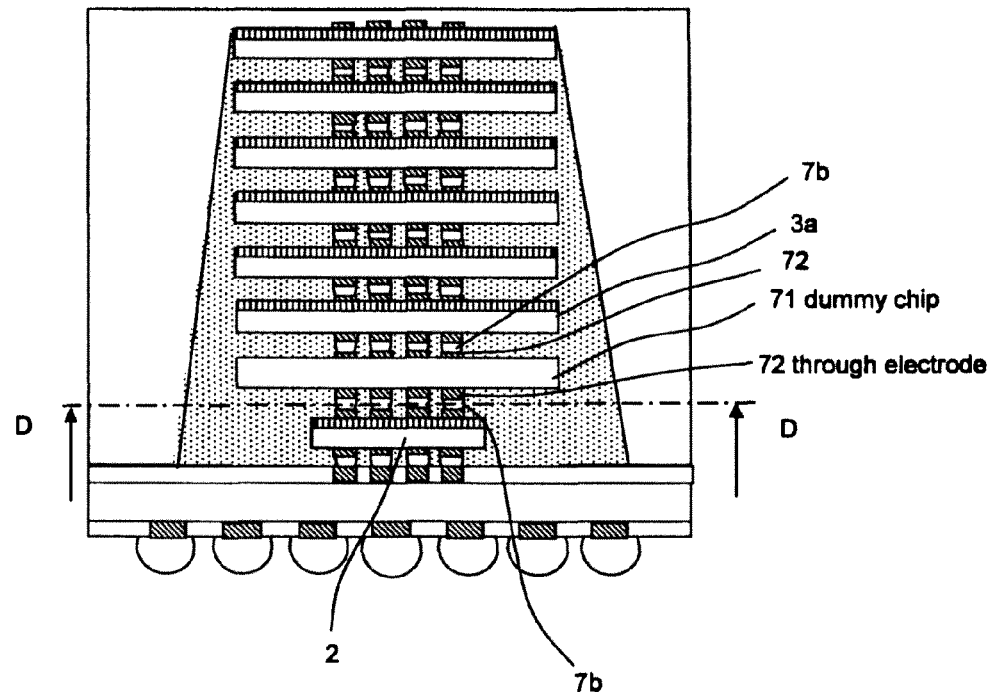
FIG. 11 is a cross-sectional view showing the structure of a semiconductor device according to a third embodiment.
Figure 12:
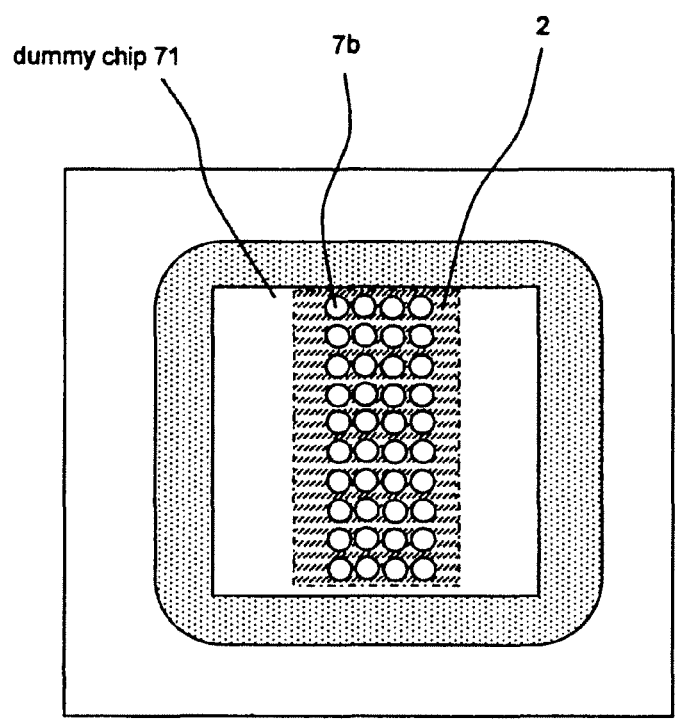
FIG. 12 is a cross-sectional view taken along cut line D-D drawing in FIG. 11.

FIG. 11 shows the structure of a semiconductor device according to a third embodiment. FIG. 12 is a cross-sectional view taken along cut line D-D drawn in FIG. 11. In the respective figures, components similar to those of semiconductor device 1 shown in FIG. 2 are designated the same reference numerals, and detailed descriptions thereon are omitted.

In this embodiment, dummy chip 71, which has a larger foot print than logic chip 2, is arranged between logic chip 2 and memory chip 3a, as shown in FIGS. 11 and 12. Dummy chip 71 is not provided with an electronic circuit (circuit formation surface), but is provided with through electrode 72 which connect through electrode 22 of logic chip 2 with through electrode 32 of memory chip 3a. Conduction bump 7b is arranged between through electrode 72 and through electrode 22, such that logic chip 2 and dummy chip 71 is connected through conduction bump 7b. Also, conduction bump 7b is arranged between through electrode 72 and through electrode 32, such that dummy chip 71 and memory chip 3a is connected through conduction bump 7b.

In this embodiment, the difference in bowing between logic chip 2 and memory chip 3a can be absorbed by disposing dummy chip 71 between logic chip 2 and memory chip 3a, which does not comprise a circuit formation surface and is substantially free from bowing. In other words, a reduction in the difference in bowing between chips results in smaller peel stress acting on bumps 7b between through electrode 22 of logic chip 2 and through electrode 72 of dummy chip 71, and smaller peel stress acting on bumps 7b between through electrode 32 of memory chip 3a and through electrode 72 of dummy chip 71. Since the stress acting on conduction bump 7b can be alleviated, the connection between chips can be reinforced to avoid a lower yield rate and lower reliability due to rupture of conduction bump 7b.

Notably, this embodiment is not limited to the implementation which combines a dummy chip with a logic chip and memory chips which differ in foot print from each other, but can be applied to the provision of a dummy chip between chips or between a chip and a substrate so that the difference in bowing can be absorbed, and further this embodiment is limited in the type and number of chips.

According to the present invention, when a plurality of semiconductor chips, each including through electrodes, are stacked and connected to one another through conduction bumps, the conduction bumps are concentrated in a central portion of the semiconductor chips, thus making it possible to alleviate peel stress which acts on the conduction bumps. In this way, defective connections are reduced between the semiconductor chips, so the reliability that the resulting semiconductor device can be improved.

It is apparent that the present invention is not limited to the above embodiments, but may be modified and changed without departing from the scope and spirit of the invention.

The invention claimed is:

1. A device comprising a first semiconductor chip and a second semiconductor chip;

the first semiconductor chip comprising:
- a first outer peripheral region and a first inner region surrounded by the first outer peripheral region;
- a plurality of first through-electrodes each formed in the first inner region and each penetrating the first semiconductor chip;
- a plurality of first electrode pads each provided on an associated one of the first through-electrodes on a first main surface side of the first semiconductor chip;
- a plurality of second electrode pads each provided on an associated one of the first through-electrodes on a second main surface side of the first semiconductor chip;
- a plurality of first reinforcement bumps each provided in the first outer peripheral region on the first main surface side of the first semiconductor chip;
- a plurality of second reinforcement bumps each provided in the first outer peripheral region on the second main surface side of the first semiconductor chip; and the second semiconductor chip comprising:
- a second outer peripheral region and a second inner region surrounded by the second outer peripheral region;
- a plurality of third electrode pads each formed in the second inner region on a first main surface side of the second semiconductor chip; and
- a plurality of third reinforcement bumps each provided in the second outer peripheral region on the first main surface side of the second semiconductor chip;

the second semiconductor chip being stacked over the first semiconductor chip such that each of the third electrode pads of the second semiconductor chip is connected to an associated one of the second electrode pads of the first semiconductor chip and each of the third reinforcement bumps of the second semiconductor chip is connected to an associated one of the second reinforcement bumps of the first semiconductor chip; and the first reinforcement bumps being arranged substantially in line on the first main surface side of the first semiconductor chip, the second reinforcement bumps being arranged substantially in line on the second main surface side of the first semiconductor chip, and the third reinforcement bumps being arranged substantially in line on the first main surface side of the second semiconductor chip.

2. The device according to claim 1, wherein the second semiconductor chip further comprises a plurality of second through-electrodes each formed in the second inner region and each penetrating the second semiconductor chip, a plurality of fourth electrode pads each provided on an associated one of the second through-electrodes on a second main" surface side of the second semiconductor chip and a plurality of fourth reinforcement bumps each provided in the second outer peripheral region on the second main surface side of the second semiconductor chip, and each of the third electrode pads of the second semiconductor chip being provided on an associated one of the second through-electrodes on the first main surface of the second semiconductor chip.

3. The device according to claim 2, further comprising a third semiconductor chip, the third semiconductor chip comprising:
- a third outer peripheral region and a third inner region surrounded by the third outer peripheral region;
- a plurality of fifth electrode pads each formed in the third inner region on a first main surface side of the third semiconductor chip;
- a plurality of fifth reinforcement bumps each provided in the third outer peripheral region on the first main surface side of the third semiconductor chip; and the third semiconductor chip being stacked over the second semiconductor chip such that each of the fifth electrodes pads of the third semiconductor chip is connected to an associated one of the fourth electrode pads of the second semiconductor chip and each of the fifth reinforcement bumps of the third semiconductor chip is connected to an associated one of the fourth reinforcement bumps of the second semiconductor chip.

4. The device according to claim 3, wherein each of the first, second and third semiconductor chips is a memory chip.

5. The device according to claim 4, wherein the first, second and third semiconductor chips are equal in area to each other.

6. The device according to claim 1, wherein each of the first and second semiconductor chips is a memory chip.

7. The device according to claim 1, wherein the first semiconductor chip further includes a plurality of fourth reinforcement bumps each provided in the first outer peripheral region on the second main surface side of the first semiconductor chip, the second semiconductor chip further including a plurality of fifth reinforcement bumps each provided in the second outer peripheral region on the first main surface side of the second semiconductor chip, the second main surface side of the first semiconductor chip being defined by first and second edges, the second and fourth reinforcement bumps of the first semiconductor chip being arranged substantially in line along the first and second edges, respectively, the first main surface side of the second semiconductor chip being defined by third and fourth edges, the third and fifth reinforcement bumps of the second semiconductor chip being arranged substantially in line along the third and fourth edges, respectively, and each of the fourth reinforcement bumps being connected to an associated one of the fifth reinforcement bumps.

8. The device according to claim 7, wherein the first and second edges are opposed to each other, and the third and fourth edges being opposed to each other.

9. A device comprising a logic chip and first and second memory chips;
the logic chip including a first electrode pads each formed on a first main surface side of the logic chip;
the first memory chip including:
- a first outer peripheral region and a first inner region surrounded by the first outer peripheral region;
- a plurality of first through-electrodes each formed in the first inner region and each penetrating the first memory;
- a plurality of second electrode pads each provided on an associated one of the first through-electrodes on a first main surface side of the first memory chip;
- a plurality of third electrode pads each provided on an associated one of the first through-electrodes on a second main surface side of the first memory chip; and
- a plurality of first reinforcement bumps each provided in the first outer peripheral region on the second main surface side of the first memory chip;

the second memory chip including:
- a second outer peripheral region and a second inner region surrounded by the second outer peripheral region;
- a plurality of fourth electrode pads each formed in the second inner region on a first main surface side of the second memory chip; and a plurality of second reinforcement bumps each provided in the second outer peripheral region on the first main surface of the second memory chip;

the first memory chip is stacked over the logic chip such that each of the second electrode pads of the first memory chip is connected to an associated one of the first electrode pads of the logic chip, and the second memory chip being stacked over the first memory chip such that each of the fourth electrode pads of the second memory chip is connected to an associated one of the third electrode pads of the first memory chip and each of the second reinforcement bumps is connected to an associated one of the first reinforcement bumps of the first memory chip; and the first reinforcement bumps being arranged substantially in line on the second main surface side of the first memory chip, and the second reinforcement bumps being arranged substantially in line on the first main surface side of the second memory chip.

10. The device according to claim 9, wherein the logic chip is smaller in at least width than each of the first and second memory chips.

11. The device according to claim 10, wherein the first memory chip is stacked over the logic chip such that the first outer peripheral region of the first memory chip is beyond peripheral edges defining an outer shape of the logic chip.

12. The device according to claim 11, wherein the second memory chip further includes a plurality of second through-electrodes each formed in the second inner region and each penetrating the second memory chip and a plurality of fifth electrode pads each provided on an associated one of the second through-electrodes on a second main surface side of the second memory chip, and each of the fourth electrode pads being provided on an associated one of the second through-electrodes on the first main surface side of the second memory chip.

13. The device according to claim 11, wherein the first memory chip further includes a plurality of third reinforcement bumps each provided in the first outer peripheral region on the first main surface side of the first memory chip.

14. The device according to claim 9, wherein the first memory chip further includes a plurality of third reinforcement bumps each provided in the first outer peripheral region on the second main surface side of the first memory chip, the second memory chip further including a plurality of fourth reinforcement bumps each provided in the second outer peripheral region on the first main surface side of the second memory chip, the second main surface of the first memory chip being defined by first and second edges, the first and third reinforcement bumps of the first memory chip being arranged substantially in line along the first and second edges, respectively, the first main surface side of the second memory chip being defined by third and fourth edges, the second and fourth reinforcement bumps of the second memory chip being arranged substantially in line along the third and fourth edges, respectively, and each of the third reinforcement bumps being connected to an associated one of the fourth reinforcement bumps.

15. The device according to claim 14, wherein the first and second edges are opposed to each other, and the third and fourth edges being opposed to each other.

16. A device comprising a first semiconductor chip and a second semiconductor chip;

the first semiconductor chip comprising:
first and second outer peripheral regions and a first inner region between the first and second outer peripheral regions;

a plurality of first through-electrodes each formed in the first inner region and each penetrating the first semiconductor chip;

a plurality of first electrode pads each provided on an associated one of the first through-electrodes on a first main surface side of the first semiconductor chip;

a plurality of second electrode pads each provided on an associated one of the first through-electrodes on a second main surface side of the first semiconductor chip;

a plurality of first bumps each provided in the first outer peripheral region on the first main surface side of the first semiconductor chip, the first bumps being arranged substantially in line;

a plurality of second bumps each provided in the second outer peripheral region on the first main surface side of the first semiconductor chip, the second bumps being arranged substantially in line;

a plurality of third bumps each provided in the first outer peripheral region on the second main surface side of the first semiconductor chip, the third bumps being arranged substantially in line; and a plurality of fourth bumps each provided in the second outer peripheral region on the second main surface side of the first semiconductor chip, the fourth bumps being arranged substantially in line;

the second semiconductor chip comprising:
third and fourth outer peripheral regions and a second inner region between the third and fourth peripheral regions;

a plurality of third electrode pads each formed in the second inner region on a first main surface side of the second semiconductor chip;

a plurality of fifth bumps each provided in the third outer peripheral region on the first main surface side of the second semiconductor chip, the fifth bumps being arranged substantially in line; and a plurality of sixth bumps each provided in the fourth outer peripheral region on the first main surface side of the second semiconductor chip, the sixth bumps being arranged substantially in line; and the second semiconductor chip being stacked over the first semiconductor chip such that each of the third electrode pads of the second semiconductor chip is connected to an associated one of the second electrode pads of the first semiconductor chip, each of the fifth bumps of the second semiconductor chip is connected to an associated one of the third bumps of the first semiconductor chip and each of the sixth bumps of the second semiconductor chip is connected to an associated one of the fourth bumps of the first semiconductor chip.

17. The device according to claim 16, wherein the second semiconductor chip further comprises:
a plurality of second through-electrodes each formed in the second inner region and each penetrating the second semiconductor chip;

a plurality of fourth electrode pads each provided on an associated one of the second through-electrodes on a second main surface side of the second semiconductor chip;

a plurality of seventh bumps each provided in the third outer peripheral region on the second main surface side of the second semiconductor chip, the seventh bumps being arranged substantially in line; and a plurality of eighth bumps each provided in the fourth outer peripheral region on the second main surface side of the second semiconductor chip, the eighth bumps being arranged substantially in line; and each of the third electrode pads being provided on an associated one of the second through-electrodes on the first main surface of the second semiconductor chip.

18. The device according to claim 17, further comprising a third semiconductor chip, the third semiconductor chip comprising:

fifth and sixth outer peripheral regions and a third inner region between the fifth and sixth peripheral regions;

a plurality of fifth electrode pads each formed in the third inner region on a first main surface side of the third semiconductor chip;

a plurality of ninth bumps each provided in the fifth outer peripheral region on the first main surface side of the third semiconductor chip, the ninth bumps being arranged substantially in line; and a plurality of tenth bumps each provided in the sixth outer peripheral region on the first main surface side of the third semiconductor chip, the ninth bumps being arranged substantially in line; and the third semiconductor chip being stacked over the second semiconductor chip such that each of the fifth electrodes pads of the third semiconductor chip is connected to an associated one of the fourth electrode pads of the second semiconductor chip, each of the ninth bumps of the third semiconductor chip is connected to an associated one of the seventh bumps of the second semiconductor chip and each of the tenth bumps of the third semiconductor chip is connected to an associated one of the eighth bumps of the second semiconductor chip.

19. The device according to claim 16, wherein the device further comprises a third semiconductor chip including a plurality of fourth electrode pads formed on a first main surface of the third semiconductor chip, and wherein the first semiconductor chip is stacked over the third semiconductor chip such that the first electrode pads of the first semiconductor chip is connected to an associated one of the third electrode pads of the third semiconductor chip.

20. The device according to claim 19, wherein the first and second semiconductor chips are substantially equal in area to each other and the third semiconductor chip is smaller in area than the first semiconductor chip.

* * * * *